US008992741B2

(12) United States Patent
Wang et al.

(10) Patent No.: US 8,992,741 B2
(45) Date of Patent: Mar. 31, 2015

(54) METHOD FOR ULTRA-UNIFORM SPUTTER DEPOSITION USING SIMULTANEOUS RF AND DC POWER ON TARGET

(75) Inventors: Rongjun Wang, Cupertino, CA (US); Xianmin Tang, San Jose, CA (US); Zhendong Liu, San Jose, CA (US); Tza-Jing Gung, San Jose, CA (US); Maurice E. Ewert, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 950 days.

(21) Appl. No.: 12/188,937

(22) Filed: Aug. 8, 2008

(65) Prior Publication Data

US 2010/0032289 A1 Feb. 11, 2010

(51) Int. Cl.
| | |
|---|---|
| C23C 14/35 | (2006.01) |
| C23C 14/54 | (2006.01) |
| C23C 14/34 | (2006.01) |
| H01J 37/34 | (2006.01) |
| H01L 21/02 | (2006.01) |
| H01J 37/32 | (2006.01) |

(52) U.S. Cl.
CPC .............. *C23C 14/54* (2013.01); *C23C 14/3492* (2013.01); *C23C 14/542* (2013.01); *H01L 21/02266* (2013.01); *C23C 14/35* (2013.01); *H01J 37/32027* (2013.01); *H01J 37/32091* (2013.01); *H01J 37/34* (2013.01); *H01J 37/347* (2013.01)
USPC ...................................... 204/192.12

(58) Field of Classification Search
CPC .... C23C 14/3492; C23C 14/35; C23C 14/54; C23C 14/542; H01L 21/02266; H01J 37/347; H01J 37/3464; H01J 37/3455
USPC ................ 204/298.01, 298.2, 192.12, 192.13
See application file for complete search history.

(56) References Cited

U.S. PATENT DOCUMENTS

| | | | |
|---|---|---|---|
| 2004/0050687 A1 | 3/2004 | Lee et al. | |
| 2005/0133365 A1* | 6/2005 | Hong et al. | ................. 204/298.2 |
| 2006/0076232 A1* | 4/2006 | Miller et al. | ............. 204/192.12 |
| 2006/0169582 A1* | 8/2006 | Brown et al. | ............. 204/298.01 |
| 2008/0083610 A1 | 4/2008 | Tang et al. | |

FOREIGN PATENT DOCUMENTS

| | | |
|---|---|---|
| CN | 1514471 A | 7/2004 |
| CN | 1929091 A | 3/2007 |
| JP | 11-61402 A | 3/1999 |
| JP | 2000-144399 A | 5/2000 |
| WO | WO 2005/061753 A1 | 7/2005 |

\* cited by examiner

*Primary Examiner* — Michael Band
(74) *Attorney, Agent, or Firm* — Robert M. Wallace

(57) ABSTRACT

In a plasma-enhanced physical vapor deposition reactor, uniformity of radial distribution of the deposition rate across the workpiece is enhanced by applying both RF and D.C. power to the target and adjusting the power levels of the RF and D.C. power independently. Further optimization is obtained by adjusting the height of the magnet above the target, adjusting the radius of the orbital motion of the magnet above the target and providing an angle edge surface of the target.

14 Claims, 7 Drawing Sheets

METHOD FOR ULTRA-UNIFORM SPUTTER DEPOSITION USING SIMULTANEOUS RF AND DC POWER ON TARGET

BACKGROUND

Fabrication of ultra-large scale integrated circuits involves deposition of metallic films using physical vapor deposition (PVD). Typically, a target is provided consisting of the material which is to be deposited as the thin film onto a workpiece or semiconductor wafer. The material may be copper, titanium, tantalum or other metal, metal oxide, metal nitride, for example. In one process, for example, titanium nitride is deposited onto a thin film structure that includes a very thin gate oxide layer of $HfO_2$ overlying a source-drain channel. Such processes are required to achieve a highly uniform distribution of deposited film thickness across the entire workpiece or wafer. Currently, PVD processes rely on short target wafer spacing, typical less than 100 mm or wafer backside bias to achieve good uniformity. However, many processes, especially processes for front-end application, require that no plasma damage be induced during the deposition. Both short target wafer spacing and wafer bias will create plasma damage on the wafer. With target wafer spacing longer than 110 mm and zero watt wafer bias, PVD processes are capable of achieving a deposited film thickness uniformity across a 300 mm diameter wafer in which the standard deviation in film thickness is about 6%. As feature size or critical dimension is being reduced down to 32 nm and below, the film thickness uniformity requirement is becoming more stringent, with the allowable standard deviation in film thickness being reduced to 1%. Current PVD processes are not capable of attaining such a high degree of uniformity on a reliable basis.

A conventional PVD reactor includes a vacuum chamber, a sputter target (copper, titanium, tantalum or other desired metal) at the reactor chamber ceiling, a support pedestal for holding the workpiece (e.g., semiconductor wafer) below and facing the ceiling, a high voltage D.C. power supply coupled to the target and a gas injection apparatus for introducing a carrier gas (e.g., argon) into the reactor chamber. The D.C. voltage on the target is sufficient to ionize the carrier gas to produce a plasma near the sputter target. A magnetron assembly consisting of a rotating magnet overlies the ceiling and the sputter target, and creates a sufficiently high magnetic field to confine the plasma near the target to produce plasma sputtering of the target. The material sputtered from the target may include both neutrals and ions of the target species, and a portion of the sputtered material deposits onto the workpiece as a thin film. In some cases, D.C. or RF bias power may be coupled to the workpiece to attract ions sputtered from the target.

The target erodes in an area covered by the magnetron. During deposition, the magnetron is moved across the ceiling in a circular or planetary motion, to distribute the target erosion and to distribute the deposition across the workpiece. However, the deposition rate distribution across the workpiece tends to be high at the center of the workpiece and low at the edge, limiting the uniformity so that the minimum deviation in deposited film thickness is in excess of 5%.

SUMMARY

A method is provided for performing plasma-enhanced physical vapor deposition on a workpiece in a chamber. A sputter target is provided in the chamber of a material or precursor of a material to be deposited on the workpiece. The workpiece is supported in the chamber facing the sputter target. A magnet overlies the sputter target. The method includes introducing a carrier gas into the chamber and applying RF power and D.C. power to the target to generate a plasma near the target and produce a corresponding deposition of material from the target onto the workpiece. The deposition has a radial distribution of a deposition rate on the workpiece. The method further includes performing one of the following:
  a. correcting one of: (a) a center-high non-uniformity in the radial distribution or (b) an edge-high non-uniformity in the radial distribution by increasing a power level of the RF power relative to a power level of the D.C. power;
  b. correcting the other one of: (a) a center-high non-uniformity in the radial distribution or (b) an edge-high non-uniformity in the radial distribution by increasing a power level of the D.C. power relative to a power level of the RF power.

In one embodiment, each of the foregoing adjustments of the RF or D.C. power levels is carried out until non-uniformity in the radial distribution has been at least nearly minimized. In one embodiment, further optimization of the radial distribution uniformity is obtained by adjusting the steepness of the magnetic field lines in which the target is immersed by adjusting the height of the magnet above the target. In another embodiment, further optimization of the radial distribution uniformity is obtained by adjusting the radius of the orbital motion with which the magnet is circulated above the target. In a further embodiment, center-high non-uniformity in the radial distribution is reduced by angling the edge surface of the target at an acute angle relative to the planar central surface of the target.

BRIEF DESCRIPTION OF THE DRAWINGS

So that the manner in which the exemplary embodiments of the present invention are attained and can be understood in detail, a more particular description of the invention, briefly summarized above, may be had by reference to the embodiments thereof which are illustrated in the appended drawings. It is to be appreciated that certain well known processes are not discussed herein in order to not obscure the invention.

Figure 1:
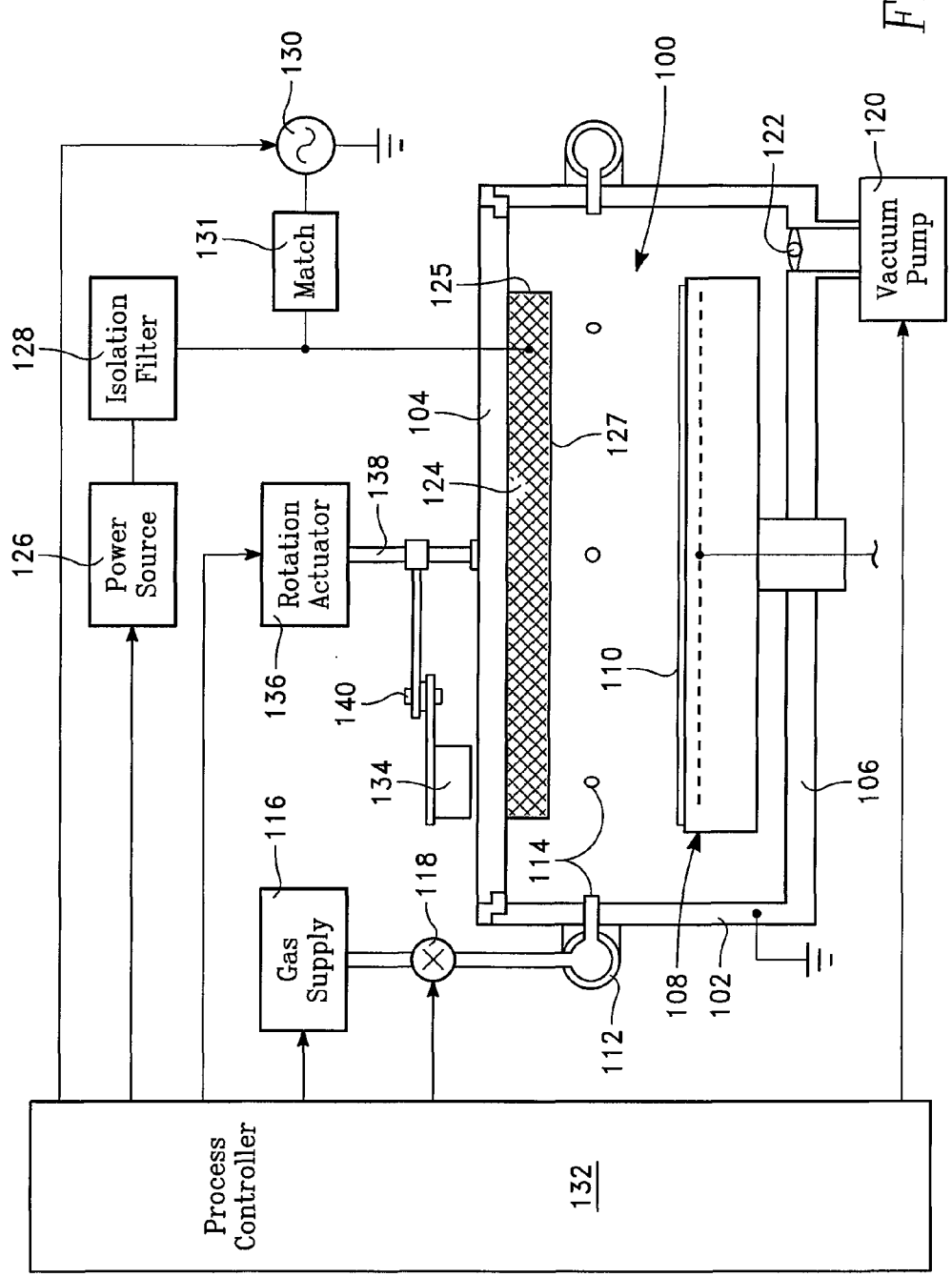
FIG. 1 is a simplified block diagram of a plasma-enhanced physical vapor deposition reactor that may be employed in carrying out methods of certain embodiments.

To facilitate understanding, identical reference numerals have been used, where possible, to designate identical elements that are common to the figures. It is contemplated that elements and features of one embodiment may be beneficially incorporated in other embodiments without further recitation. It is to be noted, however, that the appended drawings illustrate only exemplary embodiments of this invention and are therefore not to be considered limiting of its scope, for the invention may admit to other equally effective embodiments.

DETAILED DESCRIPTION

Referring now to FIG. 1, a reactor for performing PEPVD processes consists of a vacuum chamber 100 enclosed by a cylindrical side wall 102, a ceiling 104 and a floor 106. A workpiece support pedestal 108 is supported above the chamber floor 106 for holding a workpiece or wafer 110 facing the ceiling 104. A gas distribution ring 112 has plural gas injection orifices 114 extending through the side wall 102 and is supplied by a process gas supply 116 through a flow control valve 118. A vacuum pump 120 evacuates the chamber 100 through a pressure control valve 122. A sputter target 124 is supported at the ceiling 104. A D.C. power source 126 is coupled through an RF blocking filter 128 to the target 124. An RF power generator 130 is also coupled through an RF impedance match 131 to the sputter target 124. A process controller 132 controls the output power levels of the D.C. power source 126 and of the RF power generator 130. A magnetron 134 overlying the ceiling 104 is aligned over the sputter target. A rotation actuator 136 including a central spindle 138 and a planetary spindle 140 facilitates (optionally) two-axis rotation of the magnetron 134 over the ceiling so that it performs a continuous orbital motion characterized by an orbital radius. The process controller 132 can control all aspects of the reactor, including (as mentioned above) the output power levels of the D.C. and RF power sources 126, 130, as well as the process gas supply 116, the gas flow valve 118, the vacuum pump pressure control valve 122 and the magnetron rotation actuator 136.

Figure 2A:
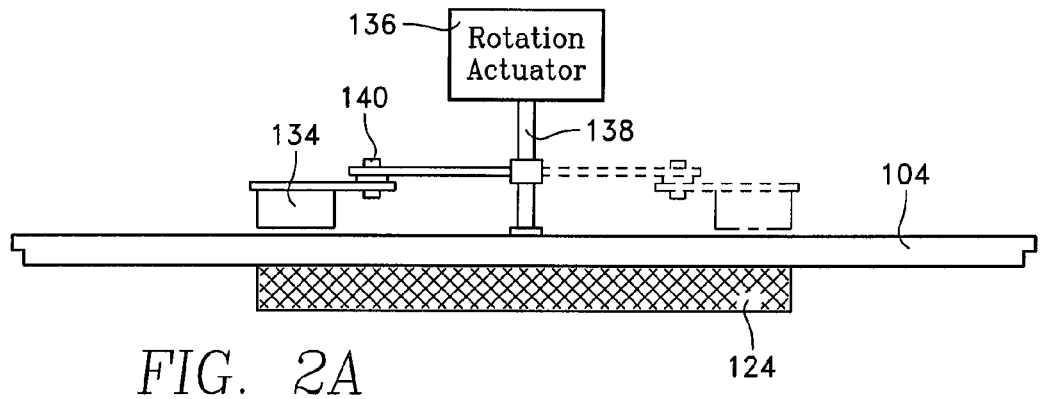
FIG. 2A depicts different positions of the magnetron relative to the target in the reactor of FIG. 1.
Figure 2B:
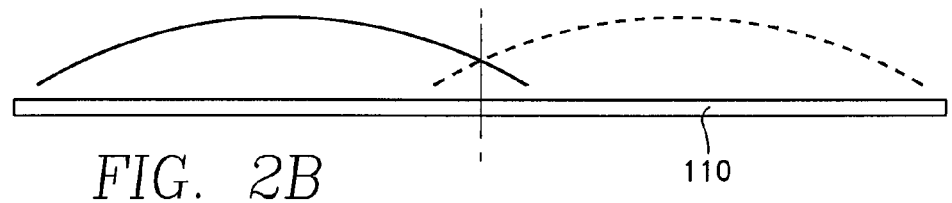
FIG. 2B is a graph corresponding to FIG. 2A depicting radial distribution of thin film deposition thickness during application of only direct current (D.C.) power to the sputter target of the reactor of FIG. 1.
Figure 2C:
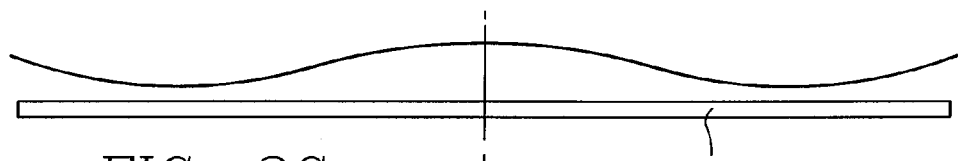
FIG. 2C is a graph corresponding to FIG. 2A depicting radial distribution of thin film deposition thickness during application of only radio frequency (RF) power to the sputter target of the reactor of FIG. 1.

FIG. 2A depicts an instantaneous position of the rotating magnetron 134 relative to the target 124, while FIG. 2B depicts the corresponding instantaneous radial distribution thin film deposition thickness (or, equivalently, rate) obtained when D.C. power only is applied to the target 124. Another instantaneous magnetron position after 180 degrees of rotation is depicted in dashed line in FIG. 2A, and the corresponding instantaneous thin film distribution is depicted in dashed line in FIG. 2B for D.C. power only. FIG. 2C depicts the resulting thin film distribution averaged over plural rotations of the magnetron. The resultant averaged distribution (FIG. 2C) is center-high, due to the non-uniformity of the instantaneous distributions (FIG. 2B). Typically, the center-high non-uniformity represents a standard deviation in the distribution of at least 5% or 6% or more.

Figure 3:
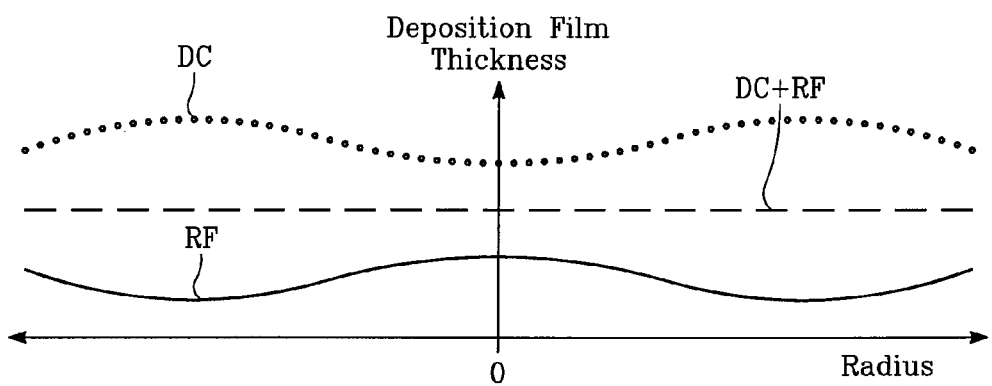
FIG. 3 is a graph depicting a resultant radial distribution of thin film deposition thickness during application of both RF and D.C. power to the sputter target, in accordance with a first embodiment.

FIG. 3 illustrates (in solid line) a radial distribution of film deposition thickness obtained when only RF power is applied to the sputter target 124. The RF-powered film distribution depicted in solid line in FIG. 3 and the D.C. powered film distribution of FIG. 2C are complementary. To clearly illustrate this, the D.C. powered film distribution of FIG. 2C is reproduced in FIG. 3 in dotted line. FIG. 3 illustrates our discovery-that both RF and D.C. power may be applied to the target 124, and with proper adjustment by the controller 132 of the D.C. and RF output power levels, the sum of D.C. and RF powered film distributions (dashed line of FIG. 3) is highly uniform, so that applying both D.C. and RF power to the target produces a uniform film thickness distribution. We have discovered that the deviation of the combined distribution may be 1% or less, which is a five-fold or six-fold improvement in uniformity. In one embodiment, the RF and D.C. powers are applied simultaneously to the target 124. In another embodiment, the RF power is applied during alternating intervals and the D.C. power is applied during remaining intervals of time. The controller 132 adjusts the RF and D.C. output power levels to maximize the uniformity of the resultant radial distribution of film thickness (dashed line of FIG. 3).

Figure 4A:
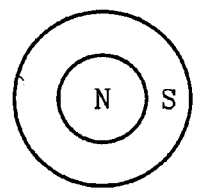
FIG. 4A depicts a first magnetron structure for use in the reactor of FIG. 1.
Figure 4B:
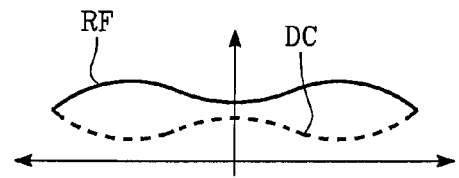
FIG. 4B is a graph of depicting radial distributions of film thickness obtained using the magnetron of FIG. 4A with (A) only RF power applied to the target and (B) only D.C. power applied to the target.

FIG. 4A depicts a first magnetic arrangement in the magnetron of FIG. 1, in which a north pole and an annular south pole around the north pole provide circular symmetry. Depicted in FIG. 4B are the radial distribution of deposited film thickness on the workpiece obtained with the magnetron of FIG. 4A with the application to the target 124 of only RF power (solid line) and only D.C. power (dashed line).

Figure 5A:
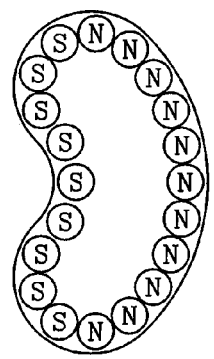
FIG. 5A depicts a second magnetron structure for use in the reactor of FIG. 1.
Figure 5B:
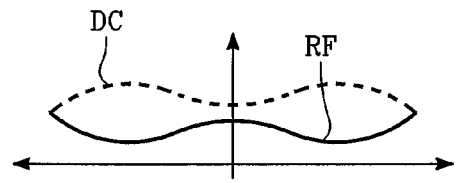
FIG. 5B is a graph of depicting radial distributions of film thickness obtained using the magnetron of FIG. 5A with (A) only RF power applied to the target and (B) only D.C. power applied to the target.

FIG. 5A depicts a second magnetic arrangement in the magnetron of FIG. 1, in which a succession of north poles is provided along one-half of a kidney-shaped boundary, and a succession of south poles is provided along the other half of the kidney-shaped boundary. Depicted in FIG. 5B are the radial distributions of deposited film thickness on the workpiece obtained with the magnetron of FIG. 5A with the application to the target 124 of (a) only RF power (solid line) and (b) only D.C. power (dashed line). Comparing FIGS. 4B and 5B, it can be seen that the results obtained with RF and D.C. power are reversed when the two magnet designs (of FIGS. 4A and 5A) are exchanged.

Figure 6:
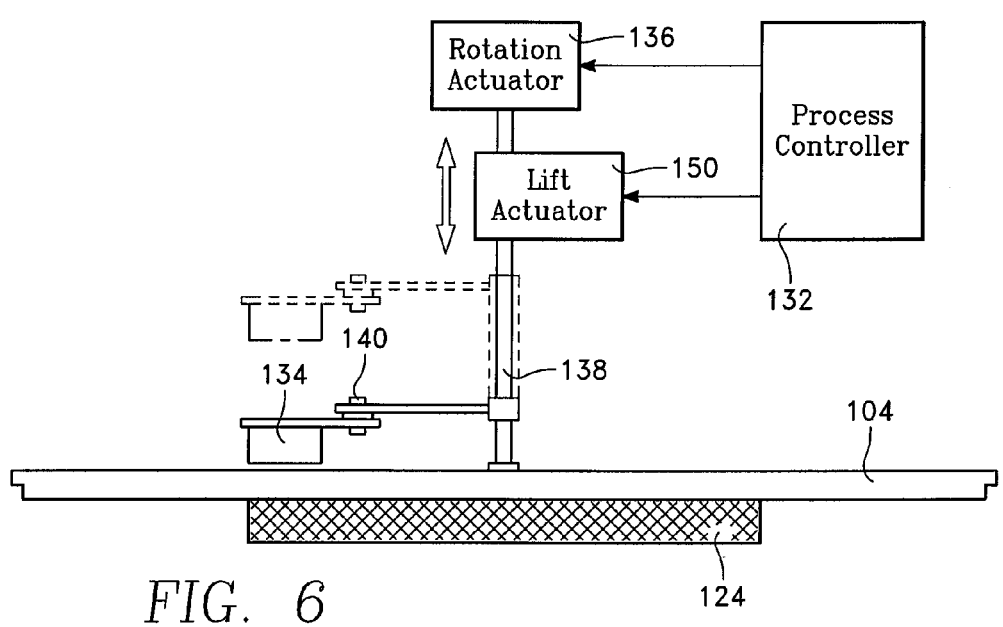
FIG. 6 depicts a modification in the magnetron assembly of the reactor of FIG. 1, in which the magnetron height above the ceiling may be changed by the controller, in accordance with a second embodiment.
Figure 7A:
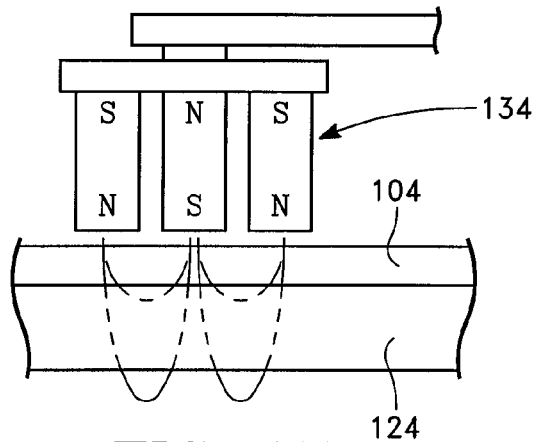
FIG. 7A depicts relationship between the sputter target and field line of the magnetron when held close to the target.
Figure 7B:
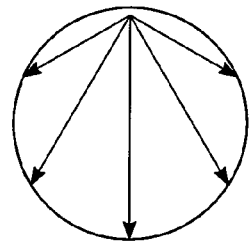
FIG. 7B is a graph depicting angular distribution of ion velocity near the target corresponding to FIG. 7A.
Figure 7C:
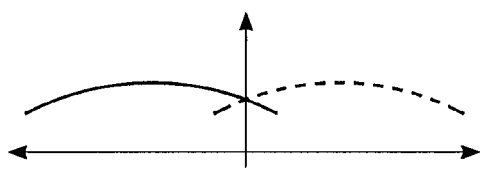
FIG. 7C depicts an instantaneous radial distribution of thin film deposition corresponding to FIG. 7A.
Figure 7D:
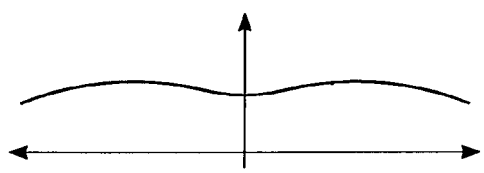
FIG. 7D depicts an average radial distribution of thin film deposition averaged over one or more rotations of the magnetron corresponding to FIG. 7A.

Referring to FIG. 6, the magnetron rotation actuator 136 may additionally include a lift actuator 150 capable of adjusting the height of the magnetron 134 above the ceiling 104 and sputter target 124. As depicted in FIG. 7A, the magnetron 134 may be of the circularly symmetrical type illustrated in FIG. 4A. When the magnetron 134 is in the solid-line position of FIG. 6 (i.e., close to the target 124), the target 124 is immersed in the shallow magnetic field lines that are closest to the magnetron 134. The result is that the angular distribution of ion velocity is broad, as depicted in FIG. 7B. The corresponding instantaneous thin film distribution rate is depicted in FIG. 7C, and has a relatively broad distribution. The resulting distribution averaged over plural rotations of the magnetron 134 is depicted in FIG. 7D, and has a center-high thin film distribution.

Figure 8A:
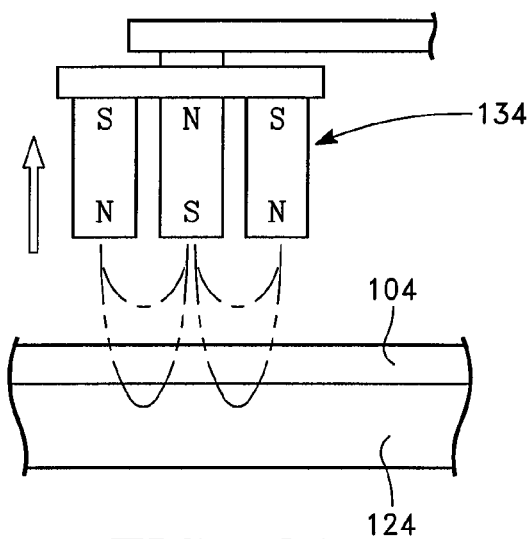
FIG. 8A depicts relationship between the sputter target and field line of the magnetron when held far from the target.
Figure 8B:
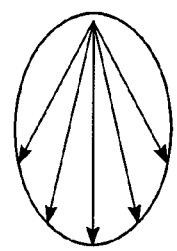
FIG. 8B is a graph depicting angular distribution of ion velocity near the target corresponding to FIG. 8A.
Figure 8C:
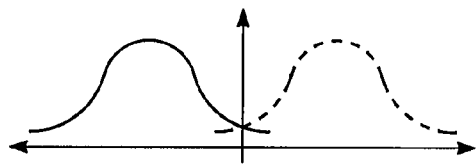
FIG. 8C depicts an instantaneous radial distribution of thin film deposition corresponding to FIG. 8A.
Figure 8D:
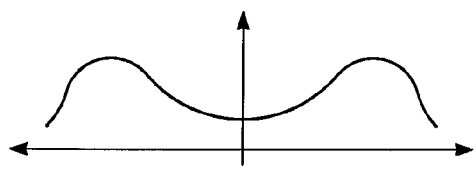
FIG. 8D depicts an average radial distribution of thin film deposition averaged over one or more rotations of the magnetron corresponding to FIG. 8A.

Referring to FIG. 8A, when the magnetron 134 is in the dashed-line position of FIG. 6 (i.e., relatively far above the target 124), the target 124 is immersed in the steep vertical magnetic field lines that are farthest from the magnetron 134. The result is that the angular distribution of ion velocity is narrow, centered about the vertical, as depicted in FIG. 8B. The corresponding instantaneous thin film distribution rate is depicted in FIG. 8C, and has a narrow distribution. The resulting distribution averaged over plural rotations of the magnetron 134 is depicted in FIG. 8D, and has a distinctly center-low thin film distribution. In accordance with a further embodiment, the controller 132 governs the magnetron lift actuator 150 and can change the magnetron height so as to adjust the thin film distribution to an optimum uniformity between the center high distribution of FIG. 7D and the center low distribution of FIG. 8D.

Figure 9A:
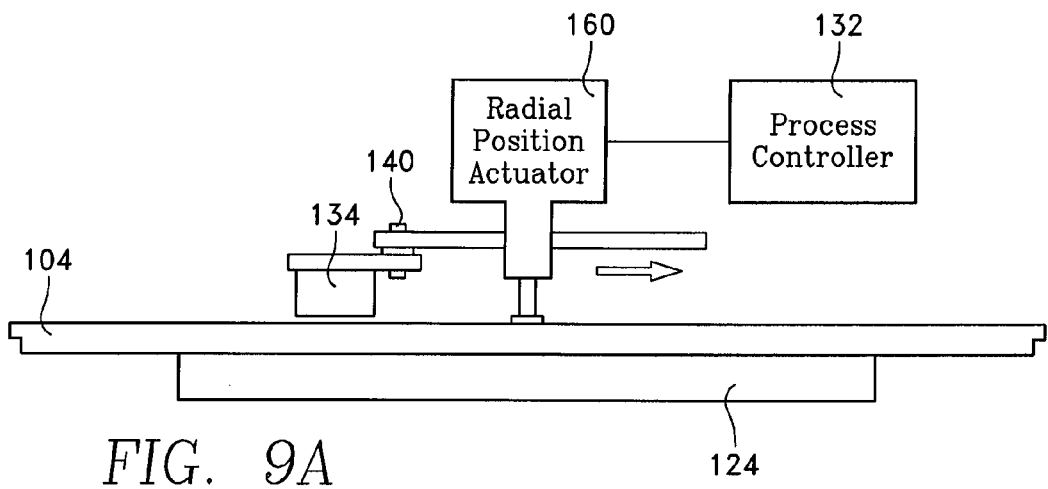
FIG. 9A depicts a modification to the reactor of FIG. 1 in which the radial position of the magnetron has been set at a small radius by the controller, in accordance with a further embodiment.
Figure 9B:
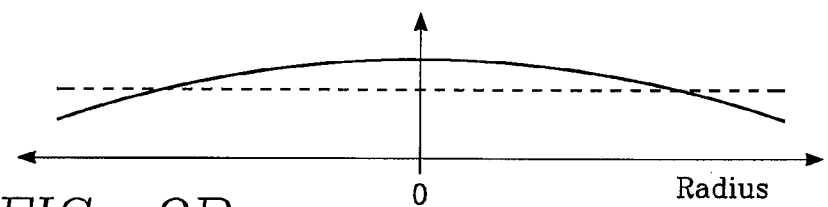
FIG. 9B is a graph depicting a center-high radial distribution of film thickness characteristic of the small radius setting of FIG. 9A.
Figure 10A:
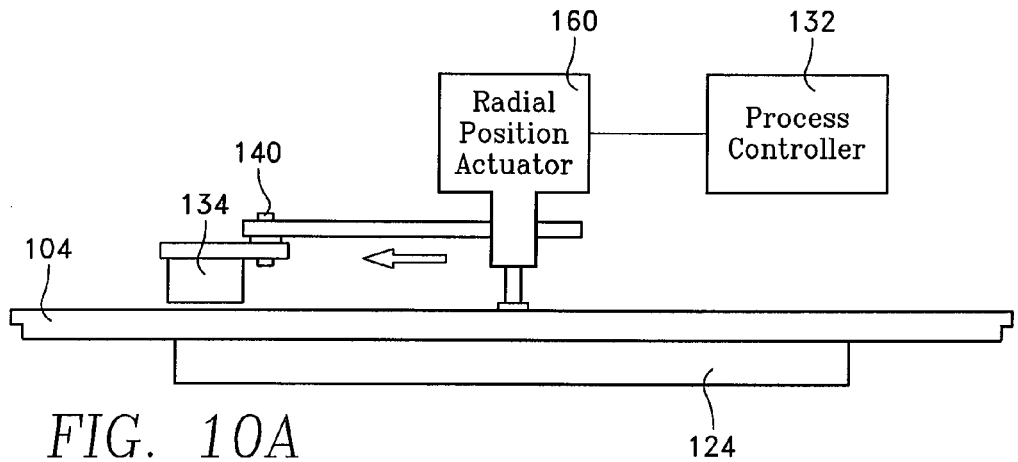
FIG. 10A depicts a modification to the reactor of FIG. 1 in which the radial position of the magnetron has been set at a large radius by the controller.
Figure 10B:
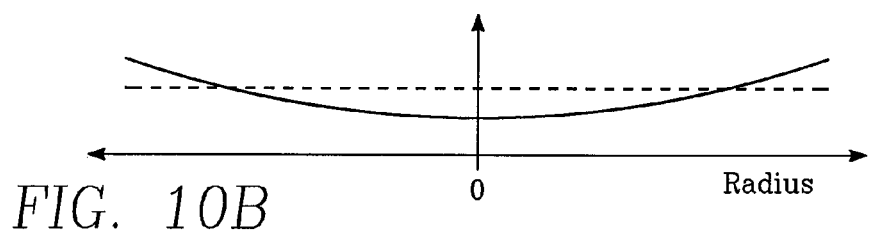
FIG. 10B is a graph depicting a center-low radial distribution of film thickness characteristic of the large radius setting of FIG. 9A, and further depicting in dashed line a resultant distribution obtained by time-averaging the different modes of FIGS. 9A and 10A.

Referring to FIG. 9A, the magnetron assembly of FIG. 1 may further include a radial position actuator 160 capable of changing the radial position of the magnetron 134 under control of the processor 132, which determines the orbital radius of the continuous circulating motion of the target 124. In FIG. 9A, the radial position is set to a minimal radius, for a minimum orbital radius of target circulatory motion. At this setting, the film deposition distribution, when averaged over plural rotations of the magnetron 134, is center-high, and is depicted in the graph of FIG. 9B. In FIG. 10A, the radial position is set to a large radius for a large orbital radius of target circulatory motion. At this setting, the film deposition distribution, when averaged over plural rotations of the magnetron 134, is center low, and is depicted in the graph of FIG. 10B. In accordance with one embodiment, the controller 132 adjusts the radial distribution of deposited film thickness by varying the radial position (or orbital radius of circulatory motion) of the magnetron 134 using the radial position actuator 160. For example, the controller can adjust the distribution shape by adjusting the relative amounts of time that the magnetron spends at greater and lesser radial positions. The result corresponds to a sum of the radial distributions of FIGS. 9B and 10B, which may be a fairly flat (uniform) distribution depicted in dashed line in FIG. 10B.

Figure 11A:
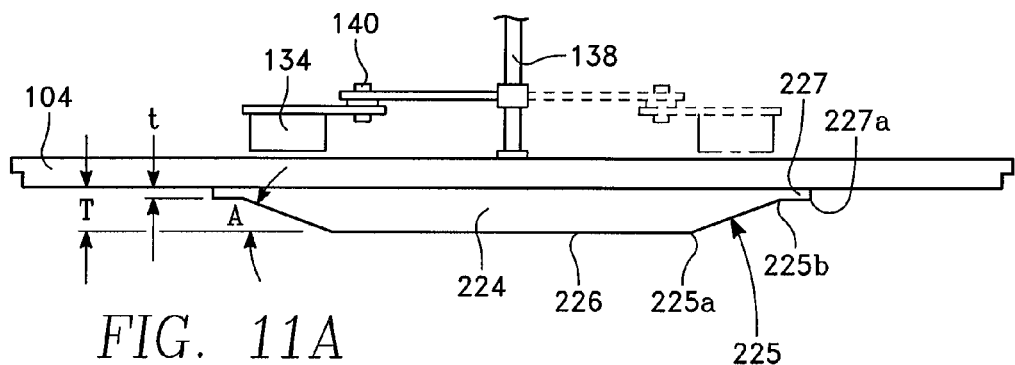
FIG. 11A is a side cross-sectional view of a sputter target that may be employed as the sputter target in the reactor of FIG. 1, the sputter target of FIG. 11 being shaped especially to improve uniformity of thin film deposition in the reactor of FIG. 1.

FIG. 11A illustrates how the sputter target 124 of FIG. 1 may be shaped to reduce the tendency of the film deposition distribution on the workpiece to be center-high. In the embodiment of FIG. 1, the sputter target 124 has a narrow side face 125 that is perpendicular to a planar face 127 of the target 124. The planar face 127 is generally parallel to the workpiece 110. In FIG. 1, all (or nearly all) of the sputtered material emanates from the target planar face 127 and therefore has an angular distribution centered about the vertical direction. The modified target 224 of FIG. 11A reduces the flow of sputtered material to the workpiece center while increasing the sputtered material flow to the workpiece edge by directing material sputtered from the edge of the target away from the center of the workpiece. In the embodiment of FIG. 11A, the sputter target 224 has a side face 225 surrounding a planar face 226. Optionally, the target 224 further includes an annular shelf 227 surrounding the side face 225. The side face 225 is oriented (sloped) at an angle "A" relative to the target planar face 226. The sloped side face 225 has an inner circular edge 225a coinciding with the periphery of the target planar face 226 and an outer circular edge 225b meeting the shelf 227. The angle A in one embodiment was 15°, although the angle A may be anywhere within a suitable range such as 5° to 50° or 3° to 70°.

Material sputtered from a target tends to be ejected in a direction generally perpendicular to the target surface from which the material was sputtered. For example, the material sputtered from the simple flat target 124 of FIG. 1 tends to have a velocity profile centered around the vertical (axial) direction. In the case of the shaped target 224 of FIG. 11A, material sputtered from the planar face 226 tends to have a velocity profile centered around the vertical direction. However, material sputtered from the sloped side face 225 tends to have a velocity profile centered around a direction perpendicular to the sloped side face 225, i.e., about 90° from the angle A. This direction is toward the periphery of the workpiece 110. As a result, the material sputtered from the sloped side face 225 contributes to thin film deposition at the workpiece periphery, thereby increasing film deposition at the workpiece edge. This reduces the tendency of the film deposition distribution to have a center-high non-uniformity. The degree to which the center-high film distribution non-uniformity is decreased may be controlled by selection of the angle A of the sloped side face 225.

Figure 11B:
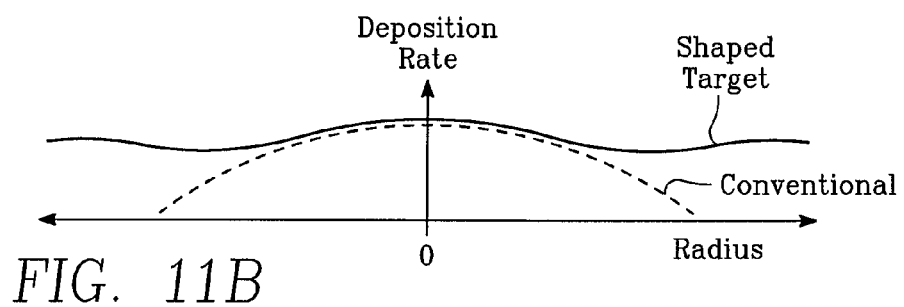
FIG. 11B compares the radial distribution (solid line) of film deposition obtained with the shaped target of FIG. 11A with the distribution (dashed line) obtained with a conventional sputter target.

FIG. 11B is a graph corresponding to FIG. 11A comparing the thin film deposition thickness distribution obtained with the shaped target 224 of FIG. 11A (solid line graph of FIG. 11B) with the distribution obtained with a conventional flat target (e.g., the target 124 of FIG. 1). The conventional target yields a non-uniform (center-high) distribution, while the shaped target 224 yields an improved distribution that is more edge-high and less center-high.

The thickness, t, of the shelf 227 is sufficient so that the shelf 227 is not completely eroded by sputtering during the life of the target 224. In the following, certain dimensions are provided as examples only, and embodiments are not limited to the following dimensions nor confined to the following ranges. The shelf thickness t may be in a suitable range such as 0.25 inch to 1 inch. In one embodiment, the thickness t was about 0.3 inches. The target thickness T in the area of the planar face 226 may be in a suitable range of about 0.5 inch to 1.5 inch. In one embodiment, the target thickness T was 0.77 inches. The diameter of the inner edge 225a of the sloped face 225 may be in a suitable range of about 9 inches to 12 inches for a workpiece diameter of about 12 inches (300 mm). In one embodiment, the inner edge 225a of the sloped faced 225 had a diameter of about 11 inches. The diameter of the outer edge 225b of the sloped face 225 may be in a suitable range of about 12 inches to 15 inches. In one embodiment, the outer edge 225b of the sloped face 225 had a diameter of about 14 inches. The diameter of the outer edge 227a of the shelf 227 may be in a suitable range of about 10 inches to 25 inches. In one embodiment, the diameter of the outer edge 227a was in a range of about 17 inches to 18 inches.

FIGS. 1-3 concern a first embodiment in which the controller 132 adjusts thin film deposition distribution by adjusting the relative amounts of RF and D.C. power applied to the target 124. FIGS. 6-8 concern a second embodiment in which the controller 132 adjusts thin film deposition distribution by adjusting the height of the magnetron 134 above the target 124. FIGS. 9-10 concern a third embodiment in which the controller 132 adjusts the thin film deposition distribution by adjusting the radial position of the magnetron 134. FIGS. 11A-11B concern a fourth embodiment in which a peripheral portion of the sputter target surface is sloped or angled to promote deposition of material near the periphery of the workpiece. Any or all of these four embodiments may be combined in a single reactor. For example, in one combination, the controller 132 controls (a) the proportion of RF and D.C. power applied to the target (FIGS. 1-3) and either (or both): (b) the distance of the magnetron 134 from the target (FIGS. 6-8) and (c) the radial position of the magnetron (FIGS. 9-10). The controller 132 may make any or all of the foregoing adjustments simultaneously or at different times to optimize uniformity of radial distribution of the deposition rate (or deposited film thickness). In another combination, the controller 132 may make any one or all of the foregoing adjustments while the reactor is provided with a shaped target of the type depicted in FIG. 11A.

Figure 12:
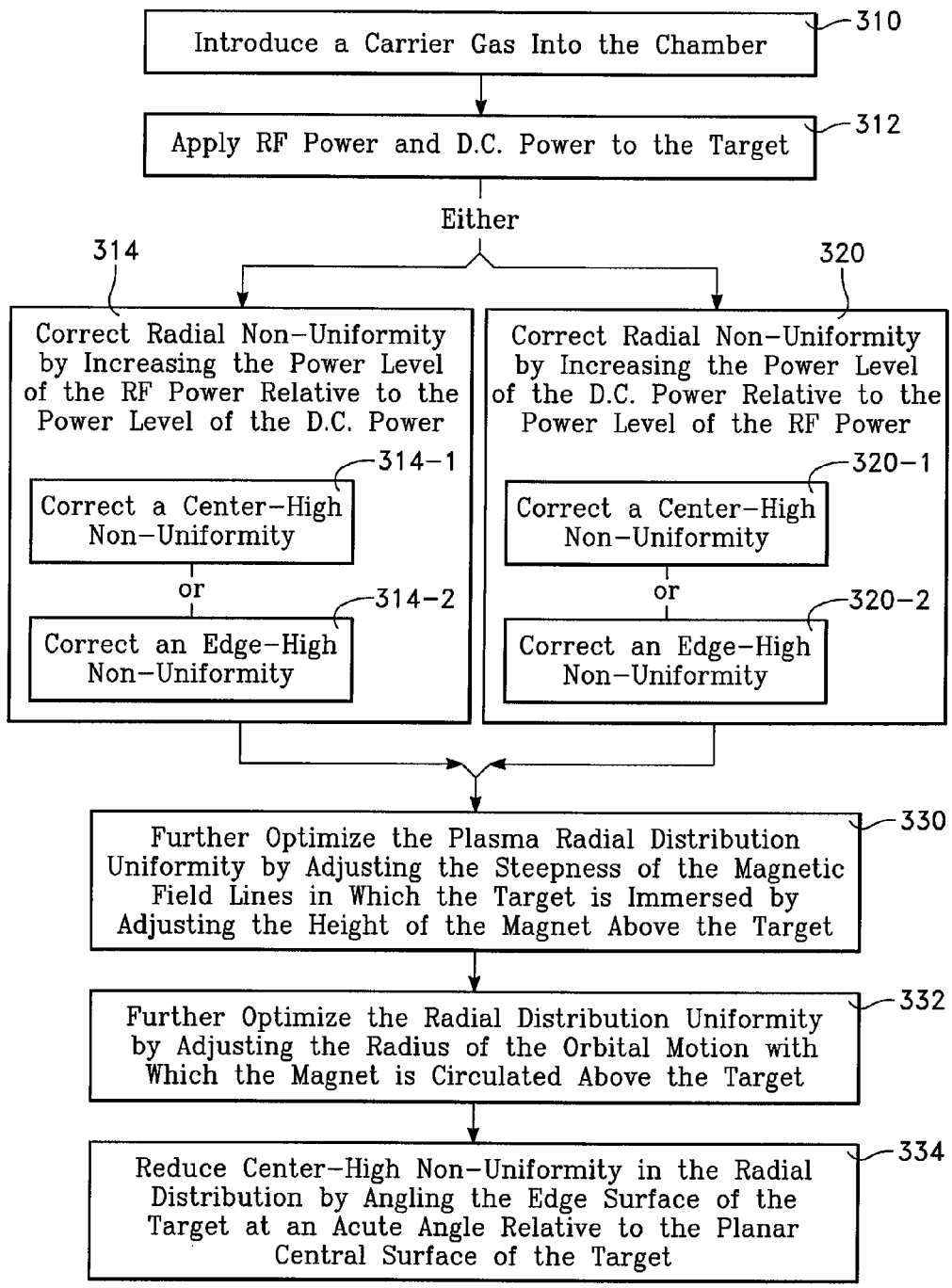
FIG. 12 is a block diagram depicting a method in accordance with an embodiment.

FIG. 12 depicts a method in accordance with embodiments described above. The method includes introducing a carrier gas into the chamber 100 of FIG. 1 (block 310 of FIG. 12) and applying RF power and D.C. power to the target 124 (block 312 of FIG. 12) to generate a plasma near the target 124 (FIG. 1) and produce a corresponding deposition of material from the target 124 onto the workpiece 110. In a first embodiment, radial non-uniformity in the distribution of the plasma is corrected by increasing the power level of the RF power relative to the power level of the D.C. power (block 314 of FIG. 12). The non-uniformity may be either (a) a center-high non-uniformity in the radial distribution (block 314-1 of FIG. 12) or (b) an edge-high non-uniformity in said radial distribution (block 314-2 of FIG. 12). In a second embodiment, radial non-uniformity in the distribution of the plasma is corrected by increasing the power level of the D.C. power relative to the power level of the RF power (block 320 of FIG. 12). The non-uniformity may be either (a) a center-high non-uniformity in the radial distribution (block 320-1 of FIG. 12) or (b) an edge-high non-uniformity in said radial distribution (block 320-2 of FIG. 12).

In one embodiment using apparatus depicted in FIG. 6, further optimization of the plasma radial distribution uniformity is obtained by adjusting the steepness of the magnetic field lines in which the target is immersed by adjusting the height of the magnet above the target (block 330 of FIG. 12). In another embodiment using apparatus depicted in FIGS. 9A and 10A, further optimization of the radial distribution uniformity is obtained by adjusting the radius of the orbital motion with which the magnet is circulated above the target (block 332 of FIG. 12). In a further embodiment depicted in FIG. 11A, center-high non-uniformity in the radial distribution is reduced by angling the edge surface 225 of the target 124 at an acute angle relative to the planar central surface of the target (block 334 of FIG. 12).

While the foregoing is directed to embodiments of the present invention, other and further embodiments of the invention may be devised without departing from the basic scope thereof, and the scope thereof is determined by the claims that follow.

What is claimed is:

1. A method of performing plasma-enhanced physical vapor deposition on a workpiece in a chamber, comprising:
   providing near a ceiling of the chamber a sputter target comprising a material or precursor of a material to be deposited on the workpiece;
   supporting the workpiece in the chamber facing the sputter target;
   introducing a gas into the chamber;
   providing a magnet overlying said sputter target and rotating said magnet relative to said sputter target;
   applying RF power to said sputter target while applying D.C. power to said sputter target to generate a plasma near said sputter target and produce a corresponding deposition of material from said sputter target onto said workpiece, said deposition of material having a radial distribution of a deposition rate on said workpiece, said radial distribution having a non-uniformity that is edge-high; and
   reducing said non-uniformity in said radial distribution by increasing a power level of said D.C. power relative to a power level of said RF power until said non-uniformity in said radial distribution is nearly minimized so as to have a standard deviation of 1% or less.

2. The method of claim 1 further comprising regulating said radial distribution by adjusting a distance between said magnet and said sputter target.

3. The method of claim 2 wherein said adjusting comprises decreasing the non-uniformity in said radial distribution by increasing the distance between said magnet and said sputter target.

4. The method of claim 2 wherein said adjusting comprises reducing the non-uniformity in said radial distribution by increasing immersion of said sputter target in field lines of said magnet having a steep trajectory relative to an axis of symmetry.

5. The method of claim 3 wherein:
   said rotating said magnet comprises continuously circulating said magnet in a plane overlying said sputter target and generally parallel to said workpiece in an orbital motion defined by an orbital radius.

6. The method of claim 5 further comprising reducing said non-uniformity in said radial distribution by decreasing said orbital radius of said orbital motion of said magnet.

7. A method of performing plasma-enhanced physical vapor deposition on a workpiece in a chamber, comprising:
   providing near a ceiling of the chamber a sputter target comprising a material or precursor of a material to be deposited on the workpiece;
   supporting the workpiece in the chamber facing the sputter target;
   introducing a gas into the chamber;
   providing a magnet overlying said sputter target and rotating said magnet relative to said sputter target;
   applying RF power to said sputter target while applying D.C. power to said sputter target to generate a plasma near said sputter target and produce a corresponding deposition of material from said sputter target onto said workpiece, said deposition of material having a radial distribution of a deposition rate on said workpiece, wherein said radial distribution has a non-uniformity that is center-high; and reducing said non-uniformity in said radial distribution by increasing a power level of said RF power relative to a power level of said D.C. power until said non-uniformity in said radial distribution is nearly minimized so as to have a standard deviation of 1% or less.

8. The method of claim 7 further comprising regulating said radial distribution by adjusting a distance between said magnet and said sputter target.

9. The method of claim 8 wherein said adjusting comprises decreasing the non-uniformity in said radial distribution by decreasing the distance between said magnet and said sputter target.

10. The method of claim 8 wherein said adjusting comprises reducing the non-uniformity in said radial distribution by increasing immersion of said sputter target in field lines of said magnet having a shallow trajectory relative to an axis of symmetry.

11. The method of claim 9 wherein:
said rotating said magnet comprises continuously circulating said magnet in a plane overlying said sputter target and generally parallel to said workpiece in an orbital motion defined by an orbital radius.

12. The method of claim 11 further comprising reducing said non-uniformity in said radial distribution by increasing said orbital radius of said orbital motion of said magnet.

13. The method of claim 7 further comprising providing said sputter target as a solid piece comprising: (a) a central surface parallel to and facing said workpiece, and (b) an edge surface transverse to surrounding said central surface, said method further comprising reducing the center-high non-uniformity in said radial distribution by orienting said edge surface at an angle less than 90° relative to said central surface, said edge surface facing radially outwardly.

14. The method of claim 13 wherein said orienting comprises orienting said edge surface at an angle in a range of 3° to 70°.

* * * * *